United States Patent
Kwon et al.

(10) Patent No.: US 8,058,180 B2
(45) Date of Patent: Nov. 15, 2011

(54) METHODS OF FABRICATING A SEMICONDUCTOR DEVICE USING A DILUTE AQUEOUS SOLUTION OF AN AMMONIA AND PEROXIDE MIXTURE

(75) Inventors: Doo-Won Kwon, Seoul (KR); Hyung-Ho Ko, Seoul (KR); Chang-Sup Mun, Incheon-si (KR); Woo-Gwan Shim, Yongin-si (KR); Im-Soo Park, Seoul (KR); Yu-Kyung Kim, Busan-si (KR); Jeong-Nam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 944 days.

(21) Appl. No.: 12/032,048

(22) Filed: Feb. 15, 2008

(65) Prior Publication Data
US 2008/0194110 A1    Aug. 14, 2008

Related U.S. Application Data

(62) Division of application No. 11/089,208, filed on Mar. 24, 2005, now Pat. No. 7,354,868.

(30) Foreign Application Priority Data

Mar. 25, 2004 (KR) .................. 10-2004-0020521

(51) Int. Cl.
*H01L 21/461* (2006.01)
*H01L 21/302* (2006.01)

(52) U.S. Cl. ................ 438/745; 257/E21.228; 438/706; 510/175

(58) Field of Classification Search ........... 257/E21.228; 438/706, 745; 510/175
See application file for complete search history.

(56) References Cited

U.S. PATENT DOCUMENTS

| 6,057,248 | A | 5/2000 | Wu et al. |
| 6,210,988 | B1 | 4/2001 | Howe et al. |
| 6,399,487 | B1 | 6/2002 | Lai et al. |
| 6,930,017 | B2 | 8/2005 | Andreas et al. |
| 2002/0004265 | A1 | 1/2002 | Vepa et al. |

FOREIGN PATENT DOCUMENTS

| JP | 2001-351869 | 12/2001 |
| JP | 2002-289533 | 10/2002 |
| JP | 2003-017670 | 1/2003 |
| KR | 100510440 B1 | 8/2005 |

*Primary Examiner* — Asok Sarkar
(74) *Attorney, Agent, or Firm* — Onello & Mello LLP

(57) ABSTRACT

This invention provides methods of fabricating semiconductor devices, wherein an alloy layer is formed on a semiconductor substrate to form a substrate structure, which methods include using an aqueous solution diluted ammonia and peroxide mixture (APM) to perform cleaning and/or wet etching treatment steps on the substrate structure.

15 Claims, 8 Drawing Sheets

US 8,058,180 B2

METHODS OF FABRICATING A SEMICONDUCTOR DEVICE USING A DILUTE AQUEOUS SOLUTION OF AN AMMONIA AND PEROXIDE MIXTURE

CROSS-REFERENCE TO RELATED APPLICATION

This application is a divisional of U.S. application Ser. No. 11/089,208, filed on Mar. 24, 2005, which relies for priority upon Korean Patent Application No. 10-2004-0020521, filed Mar. 25, 2004, the contents of which are hereby incorporated by reference in their entirety.

BACKGROUND OF INVENTION

1. Technical Field

The present invention relates generally to methods of fabricating a semiconductor device, and more particularly, to methods of fabricating a semiconductor device using a dilute aqueous solution of an ammonia and peroxide mixture (hereinafter abbreviated as "APM").

2. Discussion of the Related Art

Recently, semiconductor fabrication processes have focused on forming a transistor on a silicon-germanium layer (rather than on a substantially homogeneous single crystalline silicon substrate) in order to meet growing market demand for semiconductor devices having properties of higher speed and a higher degree of integration. The silicon-germanium layer is typically formed by applying germanium atoms to a surface of a single crystalline silicon substrate to form a silicon-germanium alloy thereon.

Using a silicon-germanium (SiGe) layer in semiconductor fabrication increases the mobility of a carrier by using a lattice constant different from the single crystalline silicon substrate conventionally used in semiconductor devices. The increase in the mobility of the carrier results in improving a current driving capability of the transistor. This gives a breakthrough for relatively easily improving the speed of a transistor of any given size rather than improving the speed by arbitrarily reducing a size thereof. The lattice constant of the silicon-germanium (SiGe) layer has been found to be proportional to the amount of germanium atoms contained in the SiGe layer.

However, the silicon-germanium layer has the disadvantageous property of being vulnerable to an aqueous solution containing ammonium hydroxide and hydrogen peroxide. This is because the silicon-germanium layer readily reacts with hydrogen peroxide ($H_2O_2$) to first form a silicon oxide layer, and that silicon oxide layer is then excessively etched by the ammonium hydroxide. Such an excessively etched silicon-germanium layer significantly impairs the performance characteristics of the resulting transistor.

U.S. Pat. No. 6,399,487 to Jane-Bai Lai, et. al (the '487 patent), which is incorporated herein by reference, discloses a method of reducing phase transition temperature by using silicon-germanium alloys.

According to the '487 patent, the method includes forming a gate of a polysilicon layer on a silicon substrate and forming a silicon-germanium alloy layer on the gate. Thereafter, a titanium layer is formed on the silicon-germanium alloy layer through a salicide process, along with forming source and drain regions overlapping the gate. The '487 patent further teaches that the titanium forms a titanium alloy wherever the titanium is in contact with the silicon-germanium alloy, but that unreacted titanium may subsequently be removed from the silicon substrate by an etching step using an aqueous solution of ammonia and hydrogen peroxide "which results in removal of all unreacted titanium, leaving behind conductive material over the source, drain, and gate but not over the spacers."

However, the aqueous solution of ammonia and hydrogen peroxide used in this step may excessively etch the upper surface and the sidewalls of the silicon-germanium alloy unless the volume ratios of ammonia and hydrogen peroxide in the aqueous solution are optimized and contact time is carefully controlled.

These and other problems with and limitations of the prior art approaches to fabricating semiconductor devices which include a silicon-germanium layer are addressed in whole or at least in part by the methods of this invention.

SUMMARY OF THE INVENTION

According to some embodiments of the present invention, there are provided methods of fabricating a semiconductor device capable of optimizing a physical property of a surface of a ($Si_{1-x}Ge_x$) alloy layer by using a dilute aqueous solution consisting essentially of an ammonia and peroxide mixture (APM), where "x" is a fraction or a decimal having a value greater than 0 but less than 1.

According to some embodiments of the present invention, there are provided methods of fabricating a semiconductor device by performing a post-cleaning process on a fabricated structure having at least one pair of elements consisting of a first material layer and a second ($Si_{1-x}Ge_x$) alloy layer using a dilute aqueous solution consisting essentially of an ammonia and peroxide mixture in order to obtain a desirable profile of the different layers.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts. In the drawings.

DETAILED DESCRIPTION OF THE INVENTION

FIGS. 1 through 5 are schematic cross-sectional views of portions of semiconductor devices illustrating a method of forming a trench in a substrate having a silicon-germanium alloy layer and another material layer according to an embodiment of the invention, respectively.

Referring to FIGS. 1 through 5, an alloy layer 20 and a material layer 30 are sequentially formed on a suitable semiconductor substrate 10. The material layer 30 may be formed, for example, of a strained silicon layer by using an epitaxial process. The alloy layer 20 is formed of a silicon-germanium ($Si_{1-x}Ge_x$) alloy layer such that germanium atoms are present in alloy layer 20 in the range of greater than 0 to about 99% by atomic weight with respect to the presence of silicon atoms. The alloy layer 20 having suitable proportions of silicon and germanium may be formed, for example, by using a chemical vapor deposition process. The substrate 10 is preferably formed of a single crystalline silicon layer, but may, in some invention embodiments, be formed of a polycrystalline silicon layer.

Figure 1:
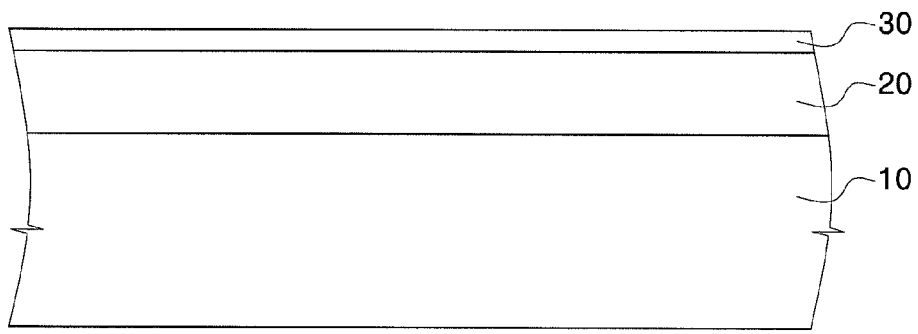
FIGS. 1 through 5 are schematic cross-sectional views of portions of semiconductor devices illustrating a method of forming a trench in a substrate having a silicon germanium alloy layer and another material layer according to an embodiment of the invention, respectively.
Figure 2:
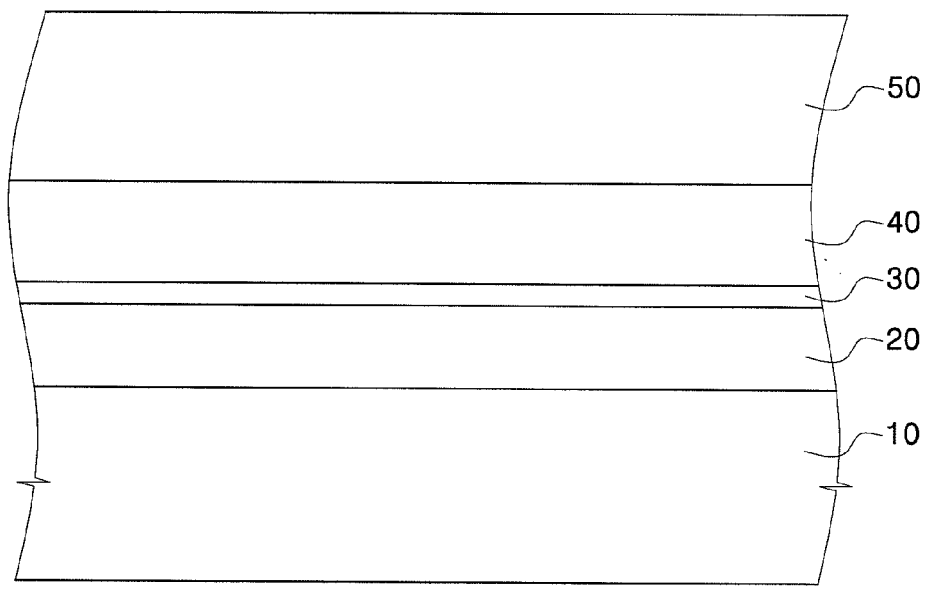
Figure 3:
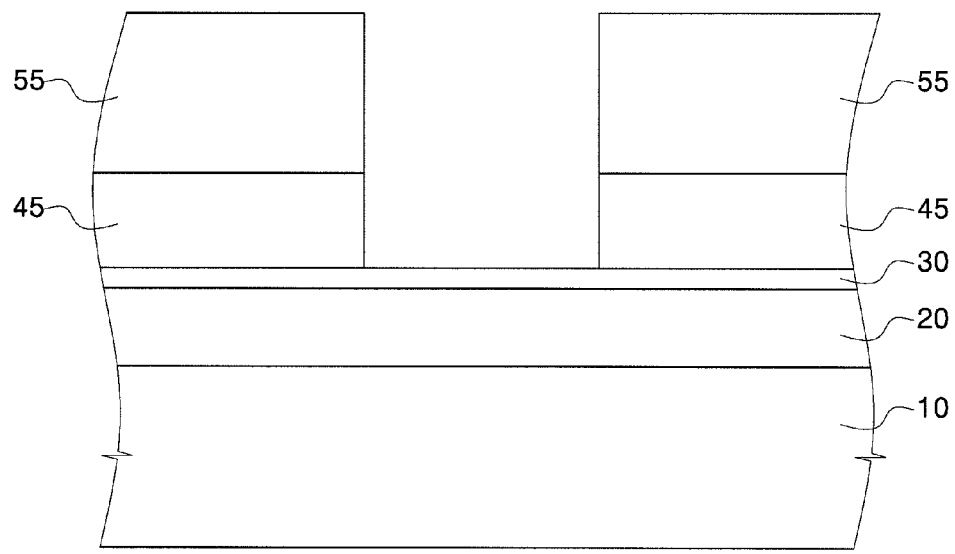

A mask layer 40 and a photoresist layer 50 are then sequentially formed on the material layer 30, as shown in FIG. 2, and a photolithography process is thereafter performed in the photoresist layer 50 to form photoresist patterns 55 (as shown in FIG. 3) on the mask layer 40. Using the photoresist patterns 55 as an etching mask, an etching process is next performed in the mask layer 40 to form mask patterns 45 between the material layer 30 and the photoresist patterns 55 as shown in FIG. 3. The etching process is preferably performed by using a dry etching technique.

Figure 4:
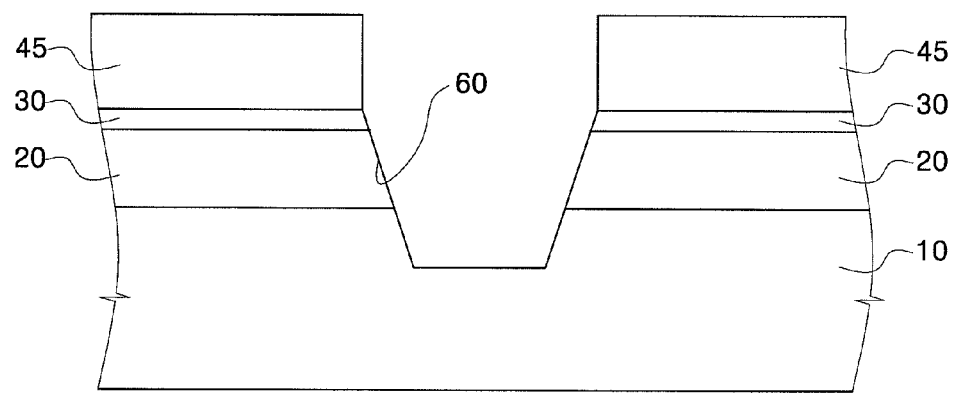

The photoresist patterns 55 are then removed from the semiconductor structure using conventional techniques. Using the mask patterns 45 as an etching mask, an etching process is then sequentially performed in the material layer 30, the alloy layer 20 and the substrate 10. The etching process is preferably performed by using a dry etching technique. This etching process results in penetrating the material layer 30 and the alloy layer 20 in order to form a trench 60 that extends in part into the substrate 10. This etching process also results in exposing a sectional surface of the alloy layer 20 adjoining the trench 60 as shown in FIG. 4. Then, the mask patterns 45 are removed from the semiconductor structure using conventional techniques.

In accordance with this invention, a post-cleaning process may now be performed on the structure to remove by-products such as organic particles and polymer from the substrate having the trench 60. The post-cleaning process is performed in accordance with this invention by using an aqueous solution consisting essentially of ammonium hydroxide ($NH_4OH$), hydrogen peroxide ($H_2O_2$), and deionized water (DI-water).

Figure 6:
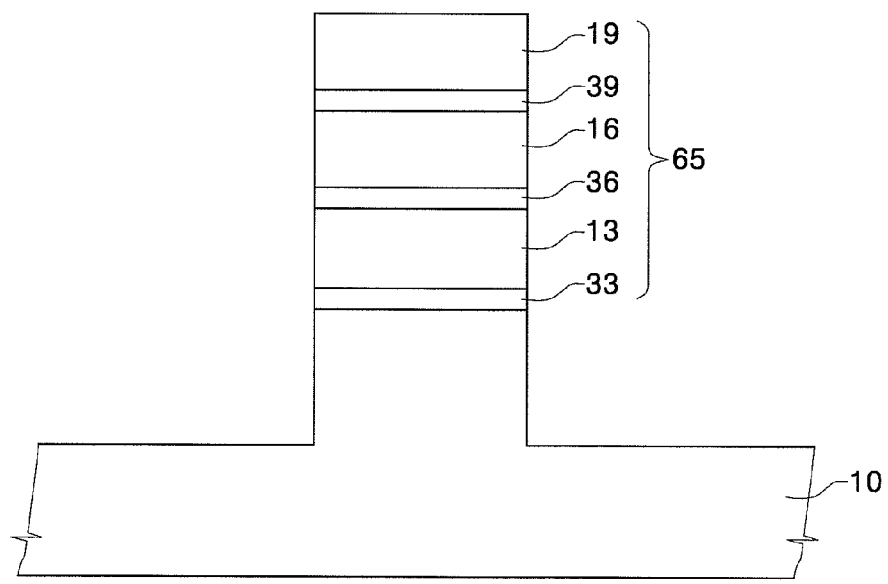
FIG. 6 is a schematic cross-sectional view of a portion of a semiconductor device showing a bar pattern having at least one pair of elements consisting of a silicon-germanium alloy layer and another material layer on a substrate according to an embodiment of the invention.

FIG. 6 is a schematic cross-sectional view of a semiconductor device showing a bar pattern having at least one pair of elements consisting of a silicon-germanium alloy layer and another material layer on a substrate according to an embodiment of the invention.

Figure 5:
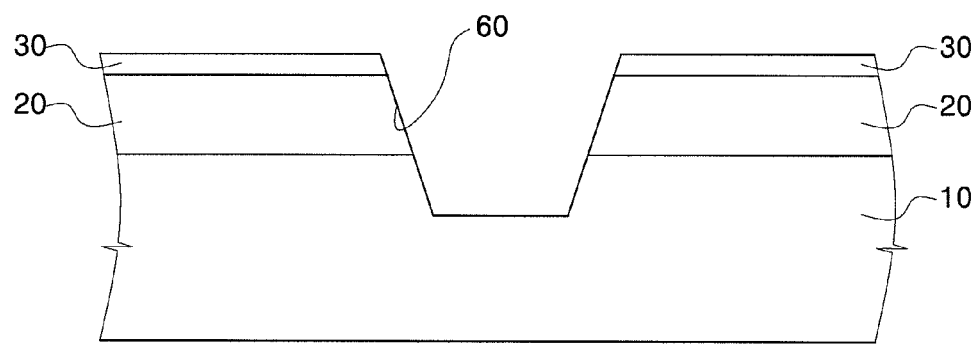

Referring to FIG. 6, a pattern having a shape different from the trench pattern 60 of FIG. 5 may be formed on the substrate 10, which has at least one element pair consisting of the alloy layer 20 and the material layer 30. That is, an etching process may be performed on a semiconductor structure comprising the substrate 10, on which alloy layers 33, 36, 39 and material layers 13, 16, 19 are alternately stacked, thereby forming a bar pattern designated by the reference numeral 65. The etching process is preferably performed by using a dry etching technique. The etching process results in exposing the respective sectional surfaces of the alloy layers 33, 36, 39 on the top of the substrate 10, as seen in FIG. 6.

In accordance with this invention, a post-cleaning process may be performed on the structure as shown in FIG. 6 to remove by-products such as organic particles and polymer from the substrate having the bar pattern 65. The post-cleaning process is performed in accordance with this invention by using an aqueous solution consisting essentially of ammonium hydroxide ($NH_4OH$), hydrogen peroxide ($H_2O_2$), and deionized water (DI-water). Hereafter, such an aqueous solution consisting essentially of ammonium hydroxide, hydrogen peroxide and deionized water, will be generally referred to as an aqueous solution APM.

Figure 7:
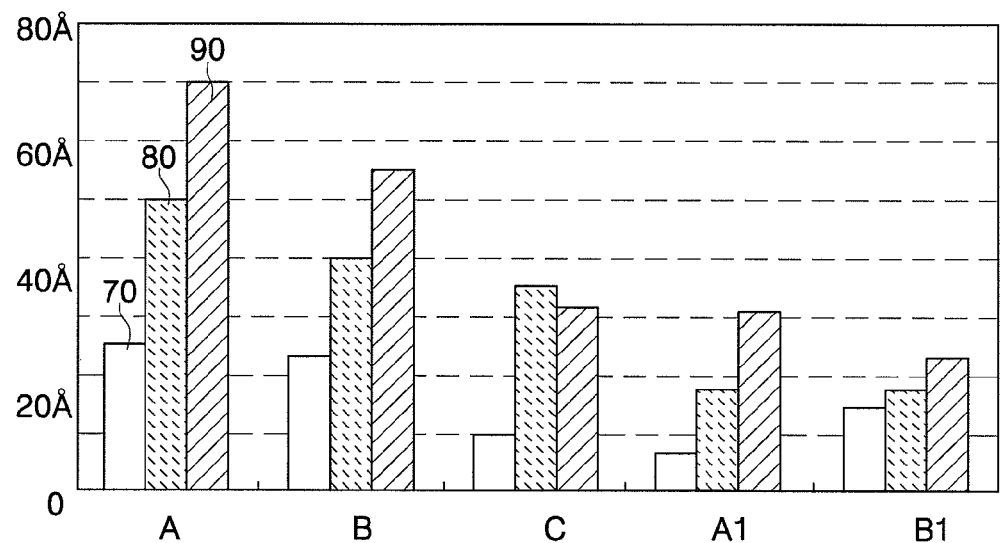
FIGS. 7 and 8 are graphs showing etching ratios of aqueous solutions containing different proportions of ammonium hydroxide, hydrogen peroxide, and water respectively.
Figure 8:
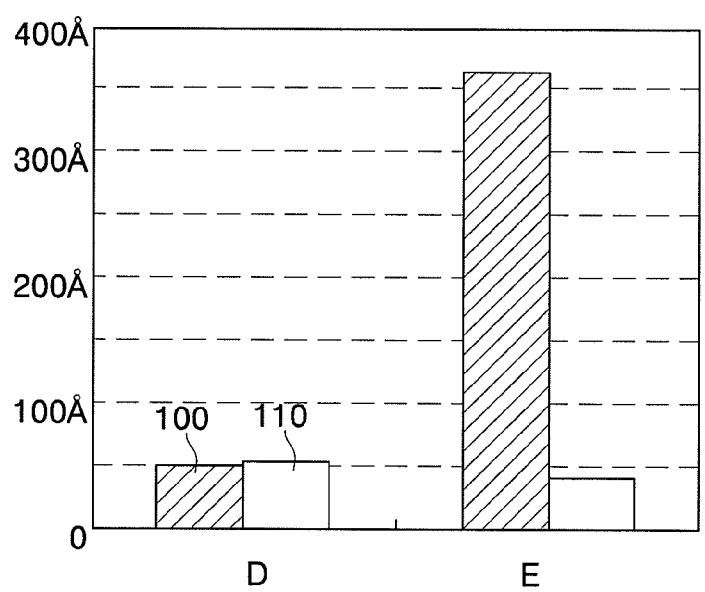

FIGS. 7 and 8 are graphs showing etching ratios of aqueous solutions containing different proportions of ammonium hydroxide, hydrogen peroxide, and DI-water respectively.

Referring to FIG. 7, substrates having polysilicon layers and substrates having alloy layers were prepared. The alloy layers were formed of silicon-germanium ($Si_{1-x}Ge_x$) layers which differ from each other in having different atomic weight percents of germanium atoms with respect to silicon atoms, respectively. More particularly, the alloy layers used in this example were a $Si_{0.8}Ge_{0.2}$ layer and a $Si_{0.7}Ge_{0.3}$ layer. The polysilicon layer was an undoped layer.

The polysilicon layer and the alloy layers were etched using aqueous solution APMs, respectively. The etching ratios of aqueous solution APMs on a polysilicon layer and an alloy layer, respectively, were examined. The aqueous solution APMs act as cleaning solutions, in which ammonium hydroxide, hydrogen peroxide, and deionized water were mixed in different volume ratios, respectively. The ammonium hydroxide in the aqueous solution APMs has a property of etching the polysilicon layer as well as the alloy layers. The hydrogen peroxide in the APM solutions decreases an oxidation speed on silicon atoms in the order of a $Si_{0.7}Ge_{0.3}$ layer, a $Si_{0.8}Ge_{0.2}$ layer, and the polysilicon layer.

Firstly, each of the five different aqueous solution APMs was applied to each of the three different substrate/layer combinations to find the etching ratios of the polysilicon layer 70, the first alloy layer ($Si_{0.8}Ge_{0.2}$) 80 and the second alloy layer ($Si_{0.7}Ge_{0.3}$) 90, respectively. FIG. 7 shows bar graphs illustrating the effect of each of the APM solutions/sample groups A, B, C, A1, B1 respectively on the etching ratios. APM solutions/sample groups A, B, C were used for etching the polysilicon layer 70 and the alloy layers 80, 90 under conditions of a treatment temperature of 65° C. and a treatment time of five minutes. Aqueous solution APMs/sample groups A, B and C use volume ratios of ammonium hydroxide, hydrogen peroxide, and deionized water of 1:1:200, 1:1:500, and 1:2:500, respectively.

The etching ratios depend respectively on the volume ratios of the deionized water in the first to third aqueous solution APMs/sample groups A, B and C in the case where the volume ratios of ammonium hydroxide to hydrogen peroxide remain constant (i.e., A and B). That is, the etching ratios decrease as the volume ratio of the deionized water increases in the second relative to the first aqueous solution APM. This is because the concentration of ammonium hydroxide is more diluted in APM solution B than in APM solution A, even at the same proportion of ammonium hydroxide to peroxide.

Further, the etching ratios decrease as the volume ratio of the hydrogen peroxide increases in the third relative to the second aqueous solution APM. This is because the peroxide is more concentrated in APM solution C than in APM solution B, even at the same proportion of the ammonium hydroxide to the deionized water. This is because the hydrogen peroxide overly oxidizes the silicon atoms of the polysilicon layer 70 and the alloy layers 80, 90, and because the hydrogen peroxide and the deionized water dilute a concentration of the ammonium hydroxide to reduce the etching ratio of the ammonium hydroxide.

Furthermore, since the first to the third aqueous solution APMs show the etching ratios non-uniformly on the polysilicon layer 70 and the alloy layers 80, 90, the first to the third aqueous solution APMs cannot be applied to a semiconductor structure in which the sectional surface of the alloy layer 20 in the trench 60 is exposed, as shown for example in FIG. 5.

In further testing, two additional APM solutions/sample groups A1 and B1 were prepared and used for etching the polysilicon layer 70 and the alloy layers 80, 90 under conditions of a treatment temperature of 50° C. and a treatment time of five minutes, respectively. The fourth and the fifth aqueous solution APMs/sample groups A1 and B1 have volume ratios of ammonium hydroxide, hydrogen peroxide, and deionized water of 1:1:200 and 1:1:500, respectively. The fourth and the fifth aqueous solution APMs/sample groups were found to have etching ratios smaller than those of the first to the third aqueous solution APMs/sample groups A, B and C as discussed above.

Even though the treatment temperature used for the first to the third aqueous solution APMs was different than the temperature used for the fourth and fifth APMs, the fourth and the fifth aqueous solution APMs demonstrate comparable etching ratios relative to the first and second APMs as the third aqueous solution APM where both the volume ratio of the deionized water and the peroxide concentration were increased. This is because a concentration of the ammonium hydroxide is diluted by the deionized water.

However, since the fourth and the fifth aqueous solution APMs shows the etching ratios non-uniformly on the polysilicon layer 70 and the alloy layers 80, 90, the fourth and the fifth aqueous solution APMs also cannot be used for treating a structure in which the sectional surface of the alloy layer 20 inside the trench 60 is exposed, as shown for example in FIG. 5.

In view of the results illustrated in FIG. 7, it is seen that aqueous solution APMs can be formulated and/or utilized so as to beneficially decrease the etching ratio of the ammonium hydroxide either by increasing the volume ratio of the deionized water relative to the ammonium hydroxide, by increasing the concentration of the hydrogen peroxide relative to the ammonium hydroxide, and/or by reducing the treatment temperature. This is because the increase of the volume ratio of the hydrogen peroxide in the third aqueous solution APM oxidizes the polysilicon layer 70 and the alloy layers 80, 90 very fast, thereby lengthening the treatment time.

Further, the reduction of the treatment temperature decreases the activation energy of the atoms of the ammonium hydroxide, thereby also decreasing the etching ratio, as shown in connection with the fourth and the fifth aqueous solution APMs. Therefore, aqueous solutions comparable to the first to fifth aqueous solution APMs show a possibility for being applied to the trench 60 as shown in FIG. 5, but only if combined with one or more of the steps of properly controlling the volume ratios of the ammonium hydroxide, the hydrogen peroxide and the deionized water; limiting the treatment time; and/or lowering the treatment temperature.

Referring to FIG. 8, sixth and seventh aqueous solution APMs having different volume ratios of ammonium hydroxide, hydrogen peroxide, and deionized water (in contrast to the APMs tested in FIG. 7), are prepared and applied to an alloy layer ($Si_{0.7}Ge_{0.3}$) 100 and a polysilicon layer 110. The results of applying the sixth and the seventh aqueous solution APMs are illustrated in the bar graphs of the two groups D and E in FIG. 8, respectively. Firstly, group D of the two groups represented in FIG. 8 is based on etching the alloy layer 100 and the polysilicon layer 110 using the sixth aqueous solution APM, which was prepared with volume ratios of the ammonium hydroxide, the hydrogen peroxide, and the deionized water of 1:1:1000, under conditions of a treatment temperature of 50° C. and a treatment time of ten minutes. Thus, the volume ratio of the deionized water of the sixth aqueous solution APM is two times the volume ratio of the deionized water used in the fifth aqueous solution APM (group B1 of FIG. 7). The sixth aqueous solution APM results in substantially the same etching ratios on the alloy layer 100 and the polysilicon layer 110, which contrasts with the results seen with group B1. This is because a concentration of the ammonium hydroxide in the sixth aqueous solution APM is more diluted than that used to produce the group B1 results. Since the sixth aqueous solution APM shows substantially the same etching ratios on the alloy layer 100 and the polysilicon layer 110, it can be used to treat a structure in which a sectional surface of the alloy layer 20 inside the trench 60 is exposed, for example as shown in FIG. 5.

Next, group E of the two groups represented in FIG. 8 is based on etching the alloy layer 100 and the polysilicon layer 110 using the seventh aqueous solution APM, which was prepared with volume ratios of the ammonium hydroxide, the hydrogen peroxide, and the deionized water of 1:2:40, under conditions of a treatment temperature of 70° C. and a treatment time of ten minutes. Testing of this seventh aqueous solution APM is intended to show a resulting change of an etching ratio in accordance with the treatment temperature and the treatment time by reducing the volume ratio of the deionized water as compared with the third aqueous solution APM (group C of FIG. 7). As seen in FIG. 8, using the seventh aqueous solution APM increases the etching ratio of the alloy layer 100 significantly compared with the polysilicon layer 110 by reducing the volume ratio of deionized water along with increasing the treatment temperature and the treatment time. However, since the seventh aqueous solution APM shows significantly different etching ratios for the alloy layer 100 and the polysilicon layer 110, it may not be used to treat a structure in which a sectional surface of the alloy layer 20 inside the trench 60 is exposed, for example as shown in FIG. 5.

Based on the comparative test data, as illustrated in FIGS. 7 and 8, it has been demonstrated that the volume ratios of the deionized water along with the ammonium hydroxide and the hydrogen peroxide can be properly varied and controlled to form an aqueous solution APM suitable for applying to the structure of FIG. 5. That is, it has been shown that the fourth and the fifth aqueous solution APMs, which have the volume ratios of the ammonium hydroxide, the hydrogen peroxide, and the deionized water in the range of 1:1:200~500, if applied at a treatment temperature of about 50° C., may be suitable for treating a structure in which a sectional surface of the alloy layer 20 inside the trench 60 is exposed, for example as shown in FIG. 5.

Further, the foregoing results show that if the volume ratio of the deionized water is set as 200, the treatment time using the fourth or the fifth aqueous solution APM must not exceed about five minutes for sufficiently removing the organic particles and polymeric by-products from the fabricated structure. This is because the etching amount of the alloy layers, e.g., 80, 90, compared with etching of the polysilicon layer, e.g., 70, increases as the treatment time increases. Therefore, in the case that the volume ratios of the ammonium hydroxide and the hydrogen peroxide is 1:1, the volume ratio of deionized water should preferably be in the range of 300~500.

Furthermore, the sixth aqueous solution APM (group D of FIG. 8) showed substantially the same etching ratio on the alloy layer 100 and the polysilicon layer 110 by using an APM solution having volume ratios of the ammonium hydroxide, the hydrogen peroxide, and the deionized water of 1:1:1000. Based on these results, it can be seen that improved results are realized if the volume ratio of the ammonium hydroxide in the fourth or the fifth aqueous solution APM of FIG. 7 is set as 1, the volume ratio of the hydrogen peroxide to the deionized water is established in the range of about 0.5~20:300~2000. Thus, the volume ratios of the ammonium hydroxide, the hydrogen peroxide, and the deionized water can be selected, for example as 1:0.5:300, in order to reduce the etching ratio of the ammonium hydroxide on the alloy ($Si_{1-x}Ge_x$) layer, by minimizing the oxidation of the alloy ($Si_{1-x}Ge_x$) layer and increasing the relative volume ratio of deionized water. On the other hand, the volume ratios of the ammonium hydroxide, the hydrogen peroxide, and the deionized water can be selected, for example as 1:20:2000, in order to reduce the etching ratio of ammonium hydroxide by increasing the volume ratio of the hydrogen peroxide within an allowable range suitable for the post-cleaning process to maximize an oxidation speed of the alloy ($Si_{1-x}Ge_x$) layer and maximize the volume ratio of the deionized water.

Hereafter, aqueous solution APMs, for example the fourth and the fifth aqueous solution APMs discussed above, having volume ratios of the ammonium hydroxide, the hydrogen peroxide, and the deionized water in the range of about 1:0.5~20:300~2000 will be referred to as "an aqueous solution diluted ammonia and peroxide mixture (APM)." In accordance with this invention, an aqueous solution diluted APM has been found to function well as a cleaning solution usable at treatment temperatures of about 50 to 70° C. Further, an aqueous solution diluted APM may be also used in some invention embodiments at a treatment temperature either below 50° C. or above 70° C.

FIGS. 9 through 14 are schematic cross-sectional views of portions of semiconductor devices treated by using various aqueous solutions consisting essentially of ammonium hydroxide and hydrogen peroxide, respectively. The various aqueous APM solutions used to treat the semiconductor structures have different volume ratios of the ammonium hydroxide, the hydrogen peroxide, and the deionized water, respectively. The various aqueous APM solutions are used in a plurality of post-cleaning processes, respectively, as described below.

Figure 9:
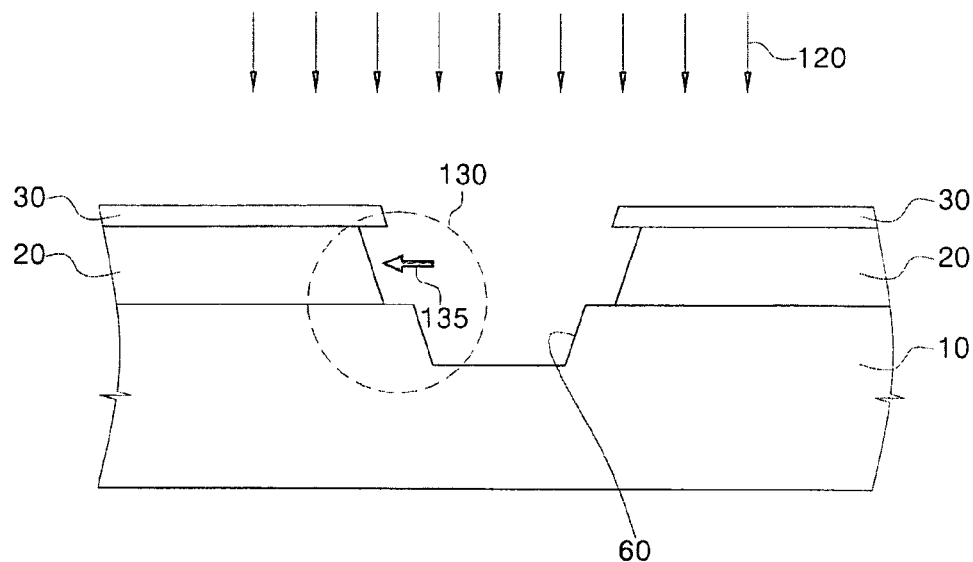
FIGS. 9 through 14 are schematic cross-sectional views of portions of semiconductor devices treated by using various aqueous solutions consisting essentially of ammonium hydroxide and hydrogen peroxide, respectively.
Figure 10:
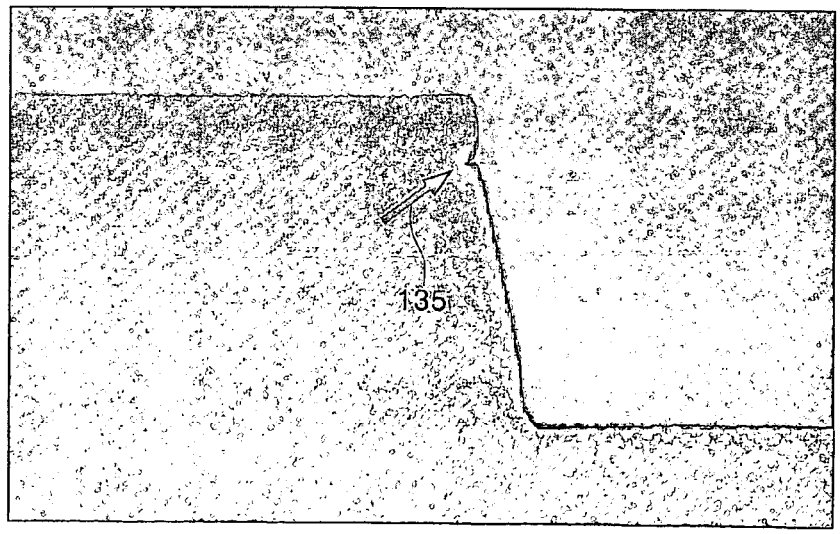

Referring to FIGS. 9 and 10, a post-cleaning process (represented by the arrows 120) is performed on the fabricated substrate structure having the trench 60 as shown in FIG. 5. In one embodiment, the post-cleaning process 120 is performed using an eighth aqueous solution APM having volume ratios of ammonium hydroxide, hydrogen peroxide, and deionized water of 1:4:20 at a temperature of 70° C. for ten minutes. The alloy layer 20 shown in FIG. 9 is formed of a silicon-germanium ($Si_{1-x}Ge_x$) layer, and the material layer 30 is formed of a strained silicon layer.

The eighth aqueous solution APM is applied to the side portions of alloy layer 20 and material layer 30 exposed along the trench 60 to remove organic particles and polymeric by-products that may remain on the sidewall and the bottom of the trench 60 after fabrication operations. The eighth aqueous solution APM partially removes portions of the alloy layer 20 adjacent to trench 60 such that the sectional surface thereof is no longer substantially in alignment with the sectional surfaces of the material layer 30 and the substrate 10, as shown in FIG. 9. As such, treatment with the eighth aqueous solution APM forms small grooves 135 on either side of the trench 60.

FIG. 10 shows an enlarged view of a portion 130 (see FIG. 9) of the trench 60 by using VSEM analysis. The formation of grooves 135 limits the application of the post-cleaning process 120 performed in the trench 60. Therefore, it is not normally acceptable to use a cleaning solution similar to the eighth aqueous solution APM on the substrate having the trench 60 as shown in FIG. 9. Such an aqueous solution APM might be modified in composition, however, or the treatment step might be modified relative to temperature and time, in the ways discussed above, for example, to reduce or minimize the formation of grooves 135 during a post-cleaning process.

Figure 11:
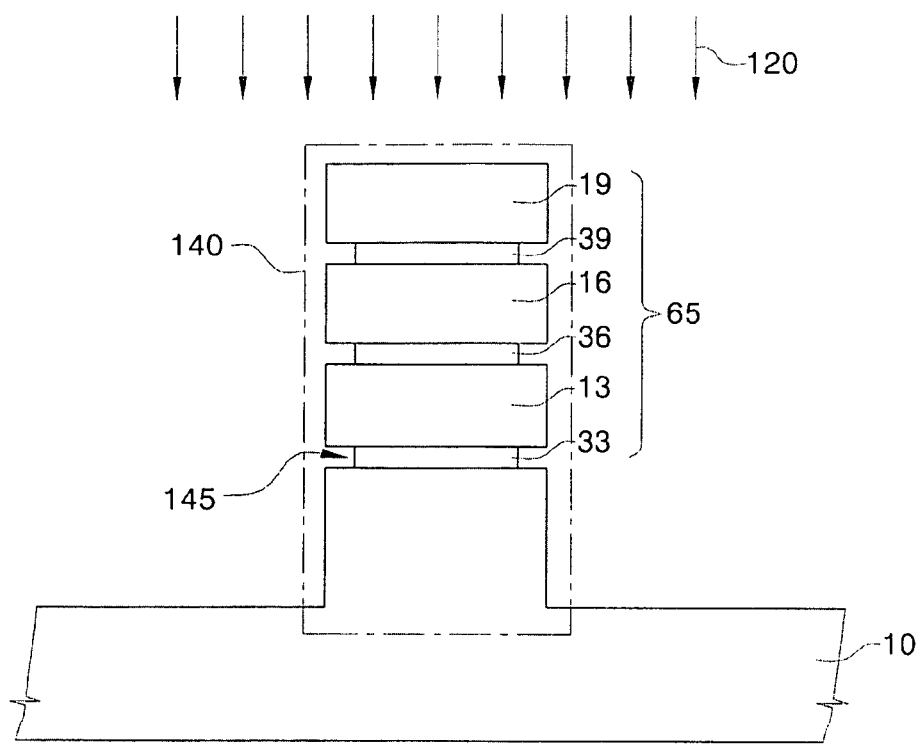
Figure 12:
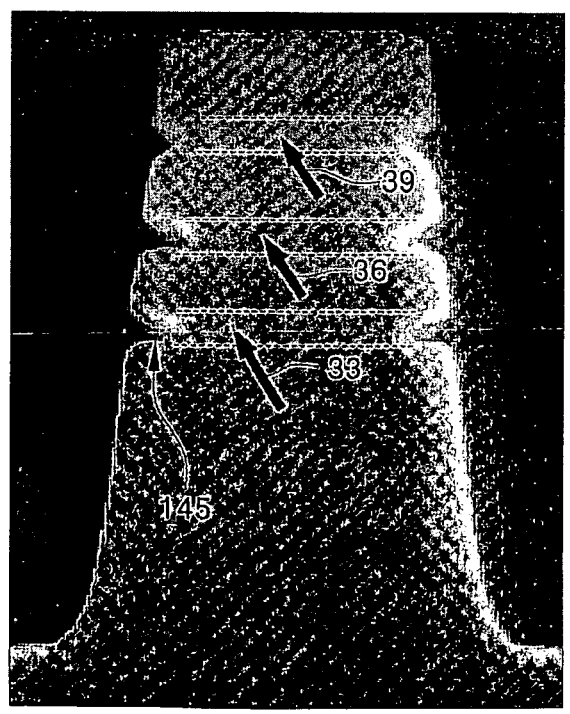

Referring to FIGS. 11 and 12, a post-cleaning process (represented by the arrows 120) is performed on the fabricated substrate structure having the bar pattern 65 as shown in FIG. 6. The bar pattern 65 is formed to have the material layers 13, 16, 19 and the alloy layers 33, 36, 39 alternately stacked. In one embodiment, the post-treatment process 120 is performed using the same eighth aqueous solution APM with the same conditions (treatment temperature, treatment time) as discussed above in connection with FIG. 9. The alloy layers 33, 36, 39 are formed of silicon-germanium ($Si_{1-x}Ge_x$) layers, respectively, and the material layers 13, 16,19 are formed of strained silicon layers, respectively.

The eighth aqueous solution APM is applied to the upper surface of top layer 19 and to the respective exposed side portions of the alloy layers 33, 36, 39 and the material layers 13, 16, 19 to remove organic particles and the polymeric by-products that may remain on the sidewalls of the bar pattern 65 and on the upper surface of the substrate 10 after fabrication operations. The eighth aqueous solution APM partially removes side portions of the alloy layers 33, 36, 39 such that the sectional surfaces thereof are no longer in alignment with the sectional surfaces of the material layers 13, 16, 19, as shown in FIG. 11. As such, treatment with the eighth aqueous solution APM forms small grooves 145 on either side of the bar pattern 65. FIG. 12 shows an enlarged view of a portion 140 (see FIG. 11) of the bar pattern 65 by using VSEM analysis. The formation of grooves 145 limits the application of the post-cleaning process 120. The post-cleaning process 120 can also lead to droplets of the APM solution running down the bar pattern 65 onto the substrate 10 causing an electrical short with adjacent patterns on the substrate. Therefore, it is not normally acceptable to use a cleaning solution similar to the eighth aqueous solution APM on the substrate having the bar pattern 65. Such an aqueous solution APM might be modified in composition, however, or the treatment step might be modified relative to temperature and time, in the ways discussed above, for example, to reduce or minimize the formation of grooves 145 during a post-cleaning process.

Figure 13:
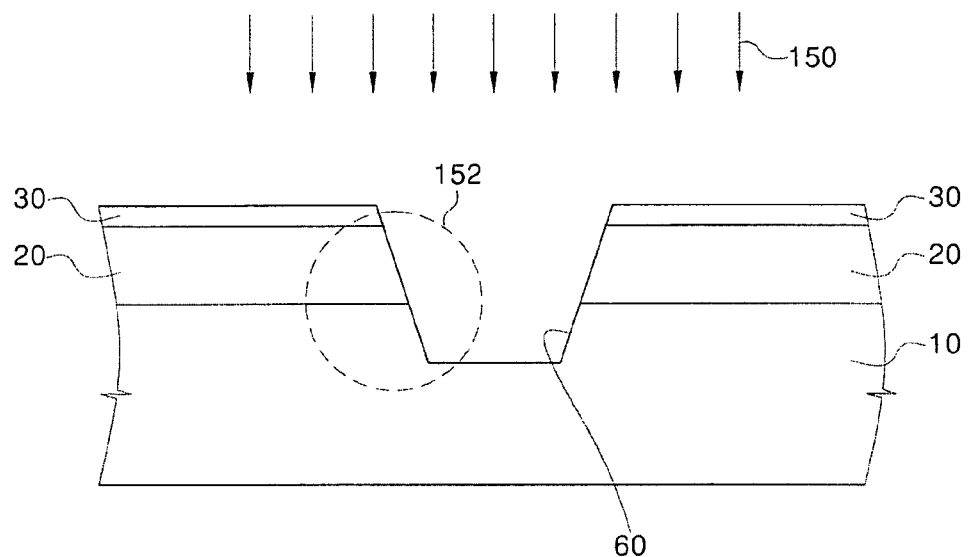
Figure 14:
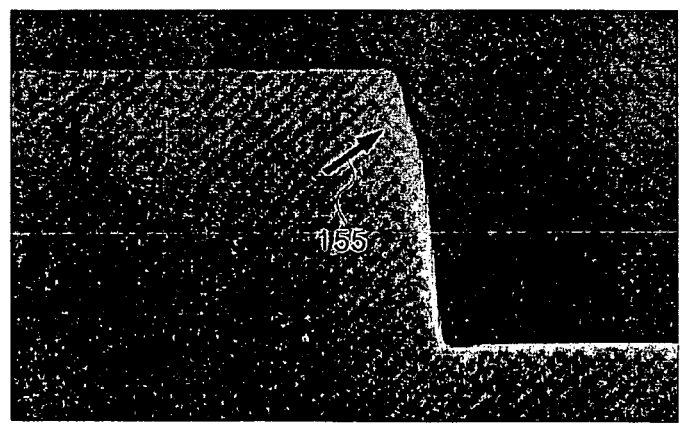

Referring to FIGS. 13 and 14, a different post-cleaning process (represented by the arrows 150) is performed on the fabricated substrate structure having the trench 60 as shown in FIG. 5. In one embodiment, this alternative post-cleaning process 150 is performed using an aqueous solution diluted APM having volume ratios of the ammonium hydroxide, the hydrogen peroxide, and the deionized water of 1:1:1000 at a temperature of 50° C. for ten minutes. The alloy layer 20 and the material layer 30 are formed comparable to that shown in FIG. 9.

The aqueous solution diluted APM is applied to the side portions of alloy layer 20 and material layer 30 exposed along the trench 60 to remove organic particles and polymeric by-products that may remain on the sidewall and the bottom of the trench 60 after fabrication operations. The aqueous solution diluted APM does not excessively etch the side wall portions of alloy layer 20 exposed along the trench 60. This is because the etching ratios of the ammonium hydroxide on the side wall portions of material layer 30 and the side wall portions of alloy layer 20 are substantially identical. The ammonium hydroxide concentration in this diluted APM solution is lower because it is more diluted by the deionized water. FIG. 14 shows an enlarged view of a portion 152 (see FIG. 13) of the trench 60 by using VSEM analysis. The aqueous solution diluted APM therefore does not limit the application of the alternative post-cleaning process 150. Accordingly, it is preferable to use the aqueous solution diluted APM on the substrate having the trench 60 as shown in FIG. 13. Correspondingly, the alternative post-cleaning process 150 may also have application to the substrate having the bar pattern 65 of FIG. 11 by using the aqueous solution diluted APM.

Furthermore, the aqueous solution diluted APM may be also used to perform a wet etching process on the trench 60 in FIG. 13, which may be plasma-damaged after the dry etching process. In this application, the aqueous solution diluted APM etches the sidewall and the bottom of the trench 60 to remove plasma-damaged layers, while applying substantially the same etching ratio to both the material layer 30 and the alloy layer 20. Such a wet etching process is typically performed for a longer time than the post-cleaning process 150.

A post-cleaning process such as process 150 may be performed by using a cleaning apparatus of a spin type, a spin spray type or a dipping type. A cleaning apparatus of the spin type is preferably used by employing at least one element selected from the apparatus element group consisting of a brush, a di-sonic device, an ultra-sonic device, and a mega-sonic device. A cleaning apparatus of the spin spray type may be used by employing at least one element selected from the apparatus element group consisting of a brush, a di-sonic device, an ultra-sonic device, and a mega-sonic device. A cleaning apparatus of the dipping type may be used by employing at least one element selected from the apparatus element group consisting of a brush, a di-sonic device, an ultra-sonic device, and a mega-sonic device.

Figure 15:
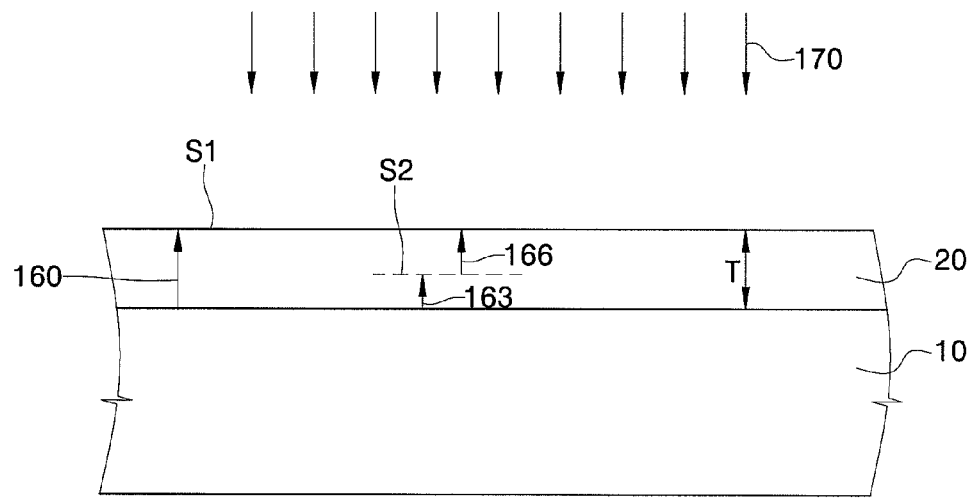
FIG. 15 is a schematic cross-sectional view of a semiconductor device having a silicon-germanium alloy layer according to an embodiment of the invention.
Figure 16:
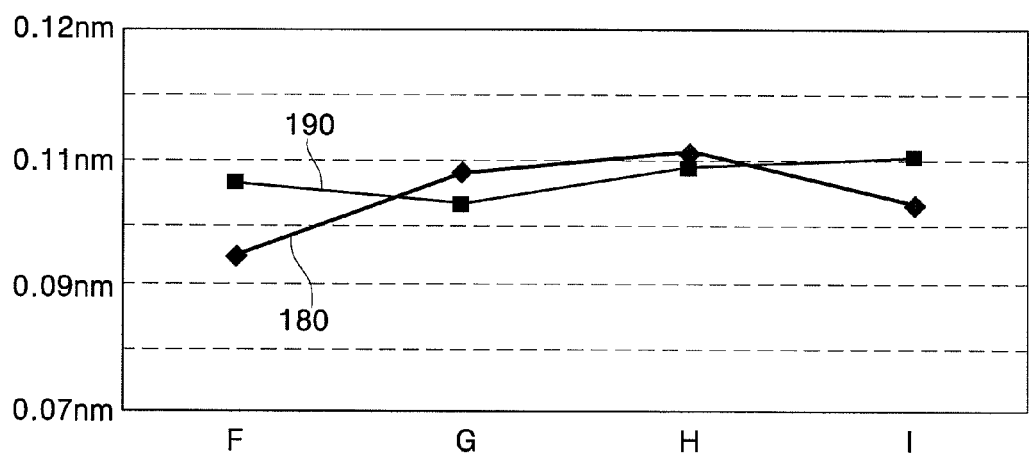
FIG. 16 is a graph showing comparative surface roughnesses of different alloy layers either left untreated or treated using aqueous solutions consisting essentially of ammonium hydroxide and hydrogen peroxide.

FIG. 15 is a schematic cross-sectional view of a portion of a semiconductor device having an alloy layer according to an embodiment of the invention, and FIG. 16 is a related graph comparing surface roughnesses of alloy layers treated by using various aqueous solutions consisting essentially of ammonium hydroxide and hydrogen peroxide.

Referring to FIG. 15, at least one growth process (represented by the single arrow 160 or, alternatively, by arrows 163 and 166) is performed on a substrate 10 to form an alloy ($Si_{1-x}Ge_x$) layer 20. The silicon-germanium alloy layer 20 is formed such that germanium atoms are present in alloy layer 20 in the range of greater than 0 to about 99% by atomic weight with respect to the presence of silicon atoms. The substrate 10 is ordinarily preferably formed of a single crystalline silicon, but in some invention embodiments the substrate 10 may instead be formed of a polycrystalline silicon. The growth process(es) to form the layer 20 on the substrate 10 may be performed, for example, by a chemical vapor deposition (CVD) process. In the case of using one growth process 160, the alloy layer 20 is formed to have a rough upper surface S1 with a predetermined thickness T. Further, in the case of using two sequential growth processes 163, 166, the alloy layer 20 is formed to have different rough surfaces (upper surface S1 and intermediate surface S2) with a predetermined total thickness T (where S2 is an intermediate surface on which additional alloy layer is formed or deposited by growth process 166 to complete the formation of layer 20).

The alloy layer 20 having the predetermined thickness T and the rough upper surface S1 may be formed, for example, by exposing a surface of substrate 10 to the atmosphere from a CVD apparatus in order to perform one growth process 160. Alternatively, the alloy layer 20 having a predetermined thickness T, the rough upper surface S1, and the rough intermediate surface S2, may be formed, for example, by exposing a surface of substrate 10 to the atmosphere from a CVD apparatus two times in order to perform two sequential growth processes 163, 166. Following formation of all or a portion of alloy layer 20, a chemical mechanical polishing process and a cleaning process (both represented by the arrows 170) may be sequentially performed to smooth the rough upper surface S1, or on each of the rough surfaces, such as on upper surface S1 and on intermediate surface S2, of the alloy layer 20 after each time the substrate 10 is exposed to atmosphere from the CVD apparatus. The chemical mechanical polishing process planarizes the rough surface S1, or each of the rough surfaces S1, S2, of the alloy layer 20, and mitigates the surface roughness. The cleaning process removes the particles generated from the chemical mechanical polishing process, and partially etches the upper surface S1, or each of the upper surface S1, and the intermediate surface S2, of the alloy layer 20, thereby to further mitigate the surface roughness.

The cleaning process may be performed by using a cleaning apparatus of a spin type, a spin spray type or a dipping type. A cleaning apparatus of the spin type is preferably used by employing at least one element selected from the apparatus element group consisting of a brush, a di-sonic device, an ultra-sonic device, and a mega-sonic device. A cleaning apparatus of the spin spray type may be used by employing at least one element selected from the apparatus element group consisting of a brush, a di-sonic device, an ultra-sonic device, and a mega-sonic device. A cleaning apparatus of the dipping type may be used by employing at least one element selected from the apparatus element group consisting of a brush, a di-sonic device, an ultra-sonic device, and a mega-sonic device.

The cleaning process used at this stage of semiconductor manufacture is generally known to use a basic organic aqueous solution which includes an effective amount of hydrofluoric acid (HF), ammonium hydroxide ($NH_4OH$) or acetic acid ($CH_3COOH$). The basic organic aqueous solution may also include an effective amount of hydrogen peroxide ($H_2O_2$), wherein the hydrogen peroxide serves to oxidize the alloy layer 20 to accelerate an etching ratio of the hydrofluoric acid, ammonium hydroxide, or acetic acid component. However, the hydrogen peroxide may etch the surface of the alloy layer 20 non-uniformly while performing this cleaning process. To cope with this situation, an aqueous solution diluted APM in accordance with this invention can instead be applied to the alloy layer 20 on substrate 10 as shown in FIG. 15 to mitigate the surface roughness of the alloy layer 20.

Alternately, an aqueous solution diluted APM in accordance with this invention may be applied to a structure having an exposed portion of substrate 10 as shown in FIG. 13 to mitigate the surface roughness thereof. This treatment procedure can also be applied to a single crystalline silicon substrate which does not have an alloy layer or a material layer on the top thereof.

Referring to FIG. 16, a graph is provided to illustrate the effectiveness in mitigating a surface roughness of a single crystalline silicon substrate by using either an aqueous solution APM selected from the first to seventh aqueous solution APMs discussed previously, or an aqueous solution diluted APM as also discussed previously. In the graph, four groups of samples, F, G, H, and I are represented. Two groups, F and G, of the four groups exhibited surface roughness values of a single crystalline silicon substrate using an atomic force microscope (AFM). One group, F, was not treated with an aqueous solution APM or with an aqueous solution diluted APM, while the other group, G, was treated with an aqueous solution APM having volume ratios of ammonium hydroxide, hydrogen peroxide, and deionized water of 1:1:500 at a treatment temperature of 50° C. Two groups H and I, of the four groups exhibited surface roughness values of a single crystalline silicon substrate. One group, H, was treated with an aqueous solution APM having volume ratios of ammonium hydroxide, hydrogen peroxide, and deionized water of 1:1:500 at a treatment temperature of 60° C., while the other group, I, of these two groups was treated with an aqueous solution diluted APM having a volume ratio of ammonium hydroxide, hydrogen peroxide, and deionized water of 1:1:1000 at a treatment temperature of 50° C. For each of the groups F, G, H, and I, the surface roughness values were checked on a central surface portion 180 and on a peripheral surface portion 190 of each single crystalline silicon substrate, respectively.

The results show that the surface treated with the aqueous solution diluted APM exhibits surface roughness values similar to those of the samples treated with different aqueous solution APMs (having different volume ratios of ammonium hydroxide, hydrogen peroxide, and deionized water), so that the aqueous solution diluted APM may be effectively used to perform the cleaning process on the alloy layer 20 of FIG. 15.

As described above, this invention provides a method of performing a cleaning process on a semiconductor structure having at least one alloy ($Si_{1-x}Ge_x$) layer by using an aqueous solution diluted APM to always maintain a substantially aligned profile of the layered structure and to mitigate a surface roughness of the at least one alloy ($Si_{1-x}Ge_x$) layer. As such, the aqueous solution diluted APM of this invention improves the cleaning process for example by reducing the limits and restrictions on using aqueous solution APMs and by minimizing or eliminating damage to a treated semiconductor structure.

Embodiments of the invention will now be described in a non-limiting way.

Embodiments of the invention provide methods of fabricating a semiconductor device by using a diluted aqueous solution of ammonia and peroxide mixture (APM) as defined herein.

According to some embodiment of the invention, there are provided methods of fabricating a semiconductor device by using an aqueous solution diluted APM that include forming an alloy layer on a substrate through at least one growth process. A cleaning process is then performed on the alloy layer using an aqueous solution diluted ammonia and peroxide mixture (APM). Volume ratios of ammonium hydroxide ($NH_4OH$), hydrogen peroxide ($H_2O_2$), and deionized water (DI-water) in the aqueous solution diluted APM are preferably in the range of about 1:0.5~20:300~2000, respectively.

According to other embodiments of the invention, there are provided methods of fabricating a semiconductor device by using an aqueous solution diluted APM that include sequentially forming at least one pair of an alloy layer and a different material layer on a substrate. A dry etching process is performed in the material layer and the alloy layer to expose sectional surfaces of the material layer and the alloy layer which are formed on top of the substrate. A cleaning process is then performed on the substrate structure having the sectional surfaces of the material layer and the alloy layer using an aqueous solution diluted APM wherein the volume ratios of ammonium hydroxide ($NH_4OH$), hydrogen peroxide ($H_2O_2$), and deionized water (DI-water) in the aqueous solution diluted APM are preferably in the range of about 1:0.5~20:300~2000, respectively.

What is claimed is:

1. A method of fabricating a semiconductor device comprising the sequential steps of:
    sequentially forming at least one pair of an alloy layer and a different material layer on a substrate;
    performing a dry etching process in the material layer and the alloy layer to expose sectional surfaces of the material layer and the alloy layer which are formed on top of the substrate; and
    performing a cleaning process on the substrate structure having the sectional surfaces of the material layer and the alloy layer using an aqueous solution diluted APM wherein the volume ratios of ammonium hydroxide ($NH_4OH$), hydrogen peroxide ($H_2O_2$), and deionized water (DI-water) in the aqueous solution diluted APM are in the range of about 1:0.5~20:300~2000, respectively.

2. The method according to claim 1, wherein the different material layer is formed of a strained silicon layer.

3. The method according to claim 1, wherein the different material layer is formed by using an epitaxial process.

4. The method according to claim 1, wherein the alloy layer is a silicon-germanium layer formed of silicon and germanium atoms wherein
    the germanium atoms are present in the alloy layer in the range of greater than 0 to about 99% by atomic weight with respect to the presence of silicon atoms.

5. The method according to claim 1, wherein the alloy layer is formed by using a chemical vapor deposition process.

6. The method according to claim 1, wherein the substrate is formed of a single crystalline silicon layer.

7. The method according to claim 1, wherein the substrate is formed of a polycrystalline silicon layer.

8. The method according to claim 1, wherein the cleaning process is performed by using a cleaning apparatus of a spin type, a spin spray type or a dipping type of apparatus.

9. The method according to claim 8, wherein a cleaning apparatus of the spin type is used by employing at least one element selected from the apparatus element group consisting of a brush, a di-sonic device, an ultra-sonic device, and a mega-sonic device.

10. The method according to claim 8, wherein a cleaning apparatus of the spin spray type is used by employing at least one element selected from the apparatus element group consisting of a brush, a di-sonic device, an ultra-sonic device, and a mega-sonic device.

11. The method according to claim 8, wherein a cleaning apparatus of the dipping type is used by employing at least one element selected from the apparatus element group consisting of a brush, a di-sonic device, an ultra-sonic device, and a mega-sonic device.

12. The method according to claim 1, further comprising a planarization step and a cleaning step sequentially performed on the alloy layer before forming the material layer thereon,
    in which the planarization step is performed by using a chemical mechanical polishing process, and the cleaning step is performed by using an aqueous solution diluted APM.

13. The method according to claim 1, wherein the dry etching step exposes the sectional surfaces of the material layer and the alloy layer by forming a trench in the at least one pair of the material layer and the alloy layer.

14. The method according to claim 1, wherein the sectional surfaces of the material layer and the alloy layer are exposed by forming a bar pattern having the at least one pair of the material layer and the alloy layer on the substrate through the dry etching process.

15. The method according to claim 1, further comprising a wet etching step, after performing the cleaning process, wherein the wet etching process is carried out using an aqueous solution diluted APM to remove plasma-damaged portions of the at least one pair of the material layer and the alloy layer.

* * * * *